United States Patent
Wu

(10) Patent No.: US 10,128,289 B2
(45) Date of Patent: Nov. 13, 2018

(54) EMBEDDED IMAGE SENSOR SEMICONDUCTOR PACKAGES AND RELATED METHODS

(71) Applicant: SEMICONDUCTOR COMPONENTS INDUSTRIES, LLC, Phoenix, AZ (US)

(72) Inventor: Weng-Jin Wu, Hsinchu (TW)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 39 days.

(21) Appl. No.: 15/262,116

(22) Filed: Sep. 12, 2016

(65) Prior Publication Data

US 2018/0076244 A1    Mar. 15, 2018

(51) Int. Cl.
*H01L 27/146* (2006.01)
*H01L 29/765* (2006.01)
*H01L 21/8234* (2006.01)

(52) U.S. Cl.
CPC .. *H01L 27/14618* (2013.01); *H01L 27/14636* (2013.01); *H01L 27/14683* (2013.01)

(58) Field of Classification Search
CPC ................................................. H01L 27/14618
USPC .......................................................... 257/433
See application file for complete search history.

(56) References Cited

U.S. PATENT DOCUMENTS

| | | | | |
|---|---|---|---|---|
| 2003/0234452 A1* | 12/2003 | Tao | ..................... | H01L 31/0203 257/777 |
| 2006/0086890 A1* | 4/2006 | Chao | .................. | H01L 27/14618 250/208.1 |
| 2009/0256260 A1* | 10/2009 | Nakamura | ........ | H01L 27/14618 257/758 |
| 2012/0104524 A1* | 5/2012 | Takeshita | .......... | H01L 27/14618 257/432 |
| 2013/0056844 A1* | 3/2013 | Oganesian | ........ | H01L 27/14618 257/443 |
| 2013/0285185 A1* | 10/2013 | Park | .................. | H01L 27/14618 257/434 |
| 2016/0104738 A1* | 4/2016 | Luan | ................. | H01L 27/14636 257/432 |

* cited by examiner

*Primary Examiner* — Moazzam Hossain
(74) *Attorney, Agent, or Firm* — IPTechLaw

(57) ABSTRACT

An embedded image sensor package including a transparent cover having a first side and an opposing second side. A first layer couples over the second side of the transparent cover and has an opening. An electrically conductive layer couples in or over the first layer and electrically couples with one or more electrical contacts exposed on an outer surface of the package. An image sensor chip having a first side with an image sensor and an opposing second side electrically couples with the electrically conductive layer at the first side of the image sensor chip. The image sensor chip couples over the first layer so the first side of the image sensor chip faces the second side of the transparent cover through the opening. The image sensor chip, first layer, and transparent cover at least partially define a cavity hermetically sealed using an underfill material. The package includes no wire-bonds.

20 Claims, 4 Drawing Sheets

EMBEDDED IMAGE SENSOR SEMICONDUCTOR PACKAGES AND RELATED METHODS

BACKGROUND

1. Technical Field

Aspects of this document relate generally to image sensors and image sensor packages.

2. Background

Image sensors convey information related to an image by communicating signals in response to incident electromagnetic radiation. Image sensors are used in a variety of devices including smart phones, digital cameras, night vision devices, medical imagers, and many others. Semiconductor imagers utilizing charge-coupled device (CCD) and complementary metal-oxide-semiconductor (CMOS) architectures exist in the art. Image sensors are conventionally packaged in various ways, such as ball grid array (BGA) and plastic leaded chip carrier (PLCC) packages.

SUMMARY

Implementations of embedded image sensor packages may include: a transparent cover having a first side and a second side opposite the first side; a first layer coupled over the second side of the transparent cover, the first layer including an opening therein; an electrically conductive layer coupled in or over the first layer and electrically coupled with one or more electrical contacts exposed on an outer surface of the package, and; an image sensor chip having a first side and a second side opposite the first side of the image sensor chip, the first side of the image sensor chip including an image sensor, the image sensor chip electrically coupled with the electrically conductive layer at the first side of the image sensor chip, the image sensor chip coupled over the first layer so that the first side of the image sensor chip faces the second side of the transparent cover through the opening; wherein the image sensor chip and the transparent cover at least partially define a cavity that is hermetically sealed using an underfill material, and; wherein the package includes no wirebonds.

Implementations of embedded image sensor packages may include one, all, or any of the following:

The image sensor chip may be electrically coupled with the electrically conductive layer using one or more bumps.

The package may be formed without the use of any liquid encapsulant except for the underfill material.

The package may not include a polymer dam used to stop a liquid flow.

The package may not include a die bond glue coupled with the image sensor chip.

A thermal dissipation metal may be coupled with the second side of the image sensor chip and may be exposed on the outer surface of the package through one or more layers of the package.

An embedded device may be electrically coupled with the image sensor chip and mechanically coupled within one or more layers of the package, the embedded device including a passive component and/or a processor.

The one or more electrical contacts may form a ball grid array (BGA) structure.

Implementations of embedded image sensor packages may include: a transparent cover having a first side and a second side opposite the first side; a first layer coupled over the second side of the transparent cover, the first layer including a laminate film having an opening therein; an electrically conductive layer coupled in or over the first layer and electrically coupled with one or more electrical contacts exposed on an outer surface of the package, and; an image sensor chip having a first side and a second side opposite the first side of the image sensor chip, the first side of the image sensor chip including an image sensor, the image sensor chip mechanically and electrically coupled with the electrically conductive layer at the first side of the image sensor chip using one or more bumps, the image sensor chip coupled over the first layer so that the first side of the image sensor chip faces the second side of the transparent cover through the opening; wherein the image sensor chip, the first layer, and the transparent cover at least partially define a cavity that is hermetically sealed using an underfill material.

Implementations of embedded image sensor packages may include one, all, or any of the following:

The package may be formed without the use of any liquid encapsulant except for the underfill material, the package may not include a die bond glue coupled with the image sensor chip, and the package may not include a polymer dam used to stop a liquid flow.

A thermal dissipation metal may be coupled with the second side of the image sensor chip and may be exposed on the outer surface of the package through one or more layers of the package, and/or; an embedded device may be electrically coupled with the image sensor chip and mechanically coupled within one or more layers of the package, the embedded device including a passive component and/or a processor.

Implementations of methods of forming embedded image sensor packages may include: providing a transparent cover having a first side and a second side opposite the first side; coupling a first layer over the second side of the transparent cover; forming an opening in the first layer; coupling an electrically conductive layer in or over the first layer; coupling an image sensor chip over the electrically conductive layer at a first side of the image sensor chip so that the first side of the image sensor chip faces the second side of the transparent cover through the opening, the image sensor chip having a second side opposite the first side of the image sensor chip, the first side of the image sensor chip including an image sensor; forming a hermetically sealed cavity between the image sensor and the transparent cover using an underfill material, and; electrically coupling one or more electrical contacts with the electrically conductive layer, forming an embedded image sensor package (package); wherein the package includes no wirebonds.

Implementations of methods of forming embedded image sensor packages may include one, all, or any of the following:

The first layer may include a laminate film.

Coupling the image sensor chip over the electrically conductive layer may include mechanically and electrically coupling the image sensor chip with the electrically conductive layer using one or more bumps.

No liquid encapsulant except the underfill material may be used in the formation of the package.

The package may not include a polymer dam used to stop a liquid flow.

No die bond glue may be used to couple the image sensor chip within the package.

Coupling a thermal dissipation metal with the second side of the image sensor chip and exposing the thermal dissipation metal on an outer surface of the package through one or more layers of the package.

Coupling an embedded device within one or more layers of the package and electrically coupling the embedded device with the image sensor chip, the embedded device including a passive component and/or a processor.

Forming a ball grid array (BGA) with the one or more electrical contacts.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended embedded image sensor semiconductor packages and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such embedded image sensor semiconductor packages and related methods, and implementing components and methods, consistent with the intended operation and methods.

Figure 1:
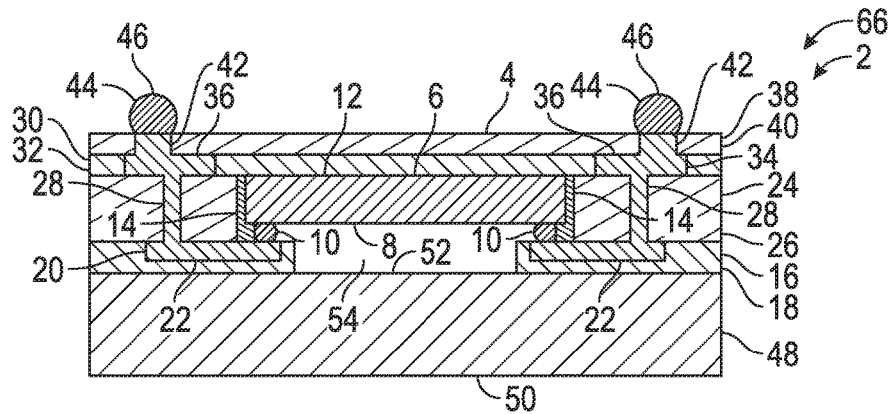
FIG. 1 is a cross-section view of an implementation of an embedded image sensor package.

Referring now to FIG. 1, an implementation of an embedded image sensor package (package) 2 is shown. This implementation is also shown in FIG. 12 in conjunction with FIGS. 5-11 which representatively illustrate cross-sections of assemblies at different processing steps used in the formation of package 2, which will be described hereafter. FIG. 1 illustrates that package 2 includes a transparent cover 48 having a first side 50 and a second side 52 opposite the first side. The transparent cover may be formed of any transparent material. In the implementation illustrated, the transparent cover is formed of glass.

An electrically insulative layer (layer) (first layer) 16 is coupled over the second side of the transparent cover and includes an opening providing access to the second side of the transparent cover. The first layer in the implementation shown is formed of a laminate film (film lamination) 18. The laminate film may be formed of an organic material, such as a polymer material, and may be in the form of a patternable molding. The pattern may be formed lithographically or through molding in various implementations. The opening could be formed in the patternable first layer, to provide access to the second side of the transparent cover, after the first layer is coupled over the second side of the transparent cover.

Materials and layer types other than laminate films could be used. For example, a deposited oxide film and/or nitride film (deposited using any material deposition techniques) could be used, or a spin-on-glass (SOG) material could be used. An SOG layer may be more expensive, however, and may require plasma etching to form the opening. A patternable molding compound (which is what is used in the representative examples in the drawings) formed using an organic/polymer laminate film may be suitable for lower stresses than oxide/nitride films even at thicker film thicknesses. Thus a patternable molding formed using an organic/polymer laminate film may be less expensive, may have lower stresses, and may be more easily patterned. A laminate film that is coupled over the second side of the transparent cover prior to being patterned, as in the case with the representative example shown in the drawings, may be patterned using any material patterning and material removal techniques such as photolithography, etching (wet etching, plasma etching), laser drilling, and so forth. Photolithography or plasma etching may be utilized in the representative examples shown in the drawings. A cleaning process may be done thereafter to remove particles or residue in and around the opening that the image sensor functioning is not inhibited or negatively affected later.

Referring still to FIG. 1, the first layer 16 includes recesses wherein a patterned electrically conductive layer (layer) 20 is formed. Layer 20 includes conductive horizontal elements (traces) 22. The traces shown in FIG. 1 are coupled within the recesses of the first layer so that the upper surfaces of the traces are flush with the upper surfaces of the first layer. In other implementations other configurations are possible. For example, the layer 20 could be partially in the recesses of the first layer 16 but could also extend above it so that the upper surfaces of the traces 22 are above the upper surfaces of the first layer 16. In other implementations the first layer could have no recess (apart from the opening) and the electrically conductive layer 20 could be deposited over the first layer. In still other implementations the electrically conductive layer 20 (i.e., traces 20) could directly contact the second side 52 of the transparent cover, either through an opening in the first layer 16 or the first layer 16 may be excluded.

Although the conductive horizontal elements 22 are called traces, this is not meant to limit the conductive horizontal elements only to elements formed by material that is left behind after a chemical (or other) material removal process.

For example, the conductive horizontal elements 22 of FIG. 1 could be formed by selectively depositing an electrically conductive material into the recesses of the first layer without needing to remove any of the material, or excess material could be removed using a mechanical instead of a chemical removal process, and they would still be considered "traces" for the purposes of this disclosure. For example, in the implementation shown a layer of electrically conductive material is deposited over the first layer using a plating process and then a grinding/polishing process is used, as will be described hereafter, to remove excess electrically conductive material and form the traces 22.

The traces 22 are formed of an electrically conductive material, which in the implementations shown is a metal, such as copper, aluminum, gold, or nickel, though other metals or metal alloys could be used. In the implementation shown the traces 22 (as well as all of the other traces and vias hereinafter described) are formed of copper.

An electrically insulative layer (layer) 24 is coupled over the layers 16 and 20. Layer 24 may be formed and patterned using any of the materials and/or techniques described above for layer 16. In the implementation shown layer 24 is a laminate film (film lamination) 26 and is patterned using photolithography and etching to form openings for electrically conductive vias (vias) 28 that will couple with the traces 22. After these openings are formed the vias 28 are formed using a material deposition technique, such as sputtering, physical vapor deposition (PVD), chemical vapor deposition (CVD), electroplating, electroless plating, or so forth. Excess material may be removed through etching, grinding, polishing, or so forth (this may also remove some of the layer 24 within which the vias 28 are formed—and there may be similar removal of laminate material in other grinding/polishing processes used with other layers). The vias 28 may be formed of any of the materials described above with respect to traces 22, and in the implementations shown are formed of copper.

After the vias are formed, an opening is made in the layer 24 exposing the traces 22 of layer 16 and providing space for an image sensor chip to be coupled within the layer 24. FIG. 1 shows an image sensor chip (chip) 6 having a first side 8 and a second side 12 on an opposite side of the chip from the first side of the chip. The first side of the chip includes an image sensor array (image sensor) and the chip is placed so that the first side of the chip, and therefore the image sensor, faces the second side of the transparent cover through the opening in the layer 16. The image sensor is not shown in the drawings but the practitioner of ordinary skill in the art will understand how an image sensor may be formed at the first side of the image sensor chip using materials and techniques now known or hereafter discovered without the image sensor needing to be illustrated in the drawings.

The image sensor chip also has electrical contacts at the first side of the chip. These are also not shown in the drawings, but may include by non-limiting example contact pads formed of a metal or other electrically conductive material, and may be flush with the first side of the chip or may extend slightly over the first side of the chip. These electrical contacts are electrically coupled with the image sensor and may be used, for example, to send information gathered by the image sensor (such as captured image data) to a processor for processing, and/or to a memory element, and/or the like. The practitioner of ordinary skill in the art will know how to form the electrical contacts at the first side of the chip 6 using materials and techniques now known or hereafter discovered without the electrical contacts needing to be illustrated in the drawings. In other implementations, the electrical contacts may be bumps, such as, by non-limiting example, solder bumps, copper studs, gold bumps, and any combination thereof.

The image sensor itself may have any of a number of configurations. For example, the image sensor could have a charge-coupled device (CCD) configuration or a complementary metal-oxide-semiconductor (CMOS) configuration. Other configurations may be possible, and the embedded image sensor packages described herein may include any of these, or any other, image sensor types. The representative examples shown in the drawings have a CMOS image sensor (CIS) configuration.

The image sensor chip is electrically and mechanically coupled with the traces 22 using one or more bumps 10 which are coupled over the electrical contacts of the first side of the image sensor chip. The bumps are formed of an electrically conductive material, such as a metal. In the implementation shown they are formed of gold and they are stud bumps. Other configurations and materials could be used. The bumps 10 could be copper stud bumps or solder bumps (such as formed of a Sn/Pb solder or a lead-free solder). In the implementation shown gold stud bumps are used because the representative example package includes a small bump count so that gold bumps, although more expensive, are used for increased reliability. Packages that include a higher bump count and/or that have other configurations to otherwise provide or increase reliability without the use of gold bumps may use less expensive materials such as copper, a Sn/Pb solder, any other lead solder, any lead-free solder, etc. In implementations the bumps could be formed of reflowable pillars instead of stud bumps, the reflowable pillars formed of one or more layers of reflowable material deposited over the electrical contacts of the image sensor chip.

Because the image sensor chip is mechanically secured within the layer 24 by the mechanical and electrical coupling of the electrical contacts of the image sensor chip with the traces 22 through the bumps 10, no die bond glue (or other adhesive material) is used to couple the image sensor chip within the package. There is thus no die bond glue or other adhesive material coupled with the image sensor chip in the formation of package 2.

FIG. 1 shows a gap between the first side of the image sensor chip (or in other words the image sensor) and the second side of the transparent cover. This gap is essentially an air-filled cavity. It is also seen in FIG. 1 that there is a gap between the left and right sides of the image sensor chip and the layer 24 (though as this is a two-dimensional cross-section it may be understood that this gap extends all the way around the perimeter of the chip so that, seen from above, it would have a rectangular outline). An underfill material 14 is used to fill in the gaps between the image sensor chip and the layer 24 and to partially fill in some of the space below the image sensor chip between the first side of the image sensor chip and the traces 22 and/or layer 16. It may be seen, however, that the majority of first side of the image sensor chip is not covered with the underfill material (in the representative example of FIG. 1 the underfill material does not extend past the bumps 10, though in other implementations it could extend somewhat past them or could not even extend all the way to the bumps though still being underneath the bottom corner edges of the chip) so that the image sensor is not covered with the underfill material and thus functions properly.

In implementations an underfill process which ensures that the underfill material surrounds the bumps 10, but does not cover the image sensor, may be desirable to compensate for different coefficients of thermal expansion (CTEs) between the chip, the bumps, the traces, the layer 16, the transparent cover, and so forth, to increase life expectancy of the package, reduce crack growth, etc. In other implementations, however, because one or more of the layers of the package are laminate materials formed of the same or similar materials, the CTE mismatches may not be so pronounced as in conventional image sensor packages, so that an underfill configuration such as that shown in FIG. 1, or even a configuration in which the underfill material does not quite reach the bumps, may be sufficient to have high package reliability and longevity.

The underfill material could be a polymer encapsulation material, an injection polymer material, an underfill material, a capillary underfill material, and/or so forth. It may be applied using capillary underfill processes, injection molding processes, or so forth. Capillary underfill processes are conventionally used to entirely cover an underside of a chip, but in the method implementations described herein the process may be tailored to not cover the portion of the underside of the chip that contains the image sensor, as is described above, such as by tailoring the amount of capillary underfill material that is placed at the top of the gap(s) between the chip and the layer 24. The capillary underfill material may be placed using a drop technique (placing drops at different locations along the rectangular outline of the second side of the chip), a tracing/line technique (dispensing the capillary underfill material at the top of the gap between the chip and layer 24 while moving the dispenser in a line tracing around the rectangular outline of the second side of the chip), etc. Such dispensing techniques may be tested and adjusted to tailor them so that a complete hermetic seal is formed between the chip and layer 24 along the sides of the chip (the four sides other than the first and second sides) but so that the image sensor is still not covered with the underfill material. In some implementations the underfill material could include a jetting type of material. In other implementations a pre-chip bonding non-conductive polymer (NCP) could be used as the underfill material.

The hermetic seal that is formed once the underfill material solidifies provides an airtight cavity (cavity) 54 between the image sensor and the second side of the transparent cover. The solidification/underfilling process may involve thermal treatment or may be performed at room temperature, depending on the material used for the underfill. The image sensor is thus protected within the airtight cavity from moisture and the like that could damage it or reduce its life.

FIG. 1 shows that an electrically insulative layer (layer) 30 is coupled over the layer 24. Layer 30 may be formed and patterned using any of the materials and techniques described above with respect to layer 16, and in the implementation shown is formed of a laminate film (film lamination) 32 and patterned in a like manner as that described above for layer 16. Openings are formed in layer 30 providing access to the vias 28 and an electrically conductive layer (layer) 34, which may be formed using any of the materials and techniques described above for layer 20, is formed within layer 30. The layer 30 includes conductive horizontal elements (traces) 36 that are thus coupled electrically with the vias 28. Layer 30 may be a redistribution layer (RDL) to provide electrical coupling between solder balls or other electrical contacts at an outside of the package and the vias 28.

FIG. 1 also shows that an electrically insulative layer (layer) 38 is formed over the layers 30 and 34. Layer 38 may be formed and patterned using any of the materials and techniques described above with respect to layer 16, and in the implementation shown is formed of a laminate film (film lamination) 40 and patterned in a like manner as that described above for layer 16. Openings are formed in layer 38 providing access to the traces 36 and electrically conductive vias (vias) 42 are formed within those openings. The vias 42 are thus electrically coupled with traces 36 and assist in the redistribution so that solder balls or other electrical contacts at an outside surface of the package may be coupled with the vias 28 and therefore with the image sensor.

Electrical contacts 44 are thus shown exposed at an outer surface 4 of the package. The electrical contacts are seen in the representative example to be solder bumps 46, which may be lead or lead-free solder bumps, though in other implementations they could have other configurations—for instance they could be contact pads instead of bumps. FIG. 1 is a simplified version of an actual package, used to illustrate the hermetically sealed cavity, the chip, the transparent cover, and other elements of an image sensor package, but more electrical contacts than those shown may be included on an outside of the package, and the electrical contacts may thus be understood to form a ball grid array (BGA) 66 in the representative illustration (and the package thus forms a BGA package). Other electrical contact configurations could be used, however, including leadless and leaded designs. The traces 22 of the electrically conductive layer 20 are in electrical communication with the electrical contacts 44 which are exposed at the outer surface 4 of the package.

Modifications could be made to package 2. For example, in implementations where no redistribution is needed the layer 38 could be excluded and the electrical contacts could be formed directly over vias that pass through layers 30 and 20 to the traces 22.

Figure 2:
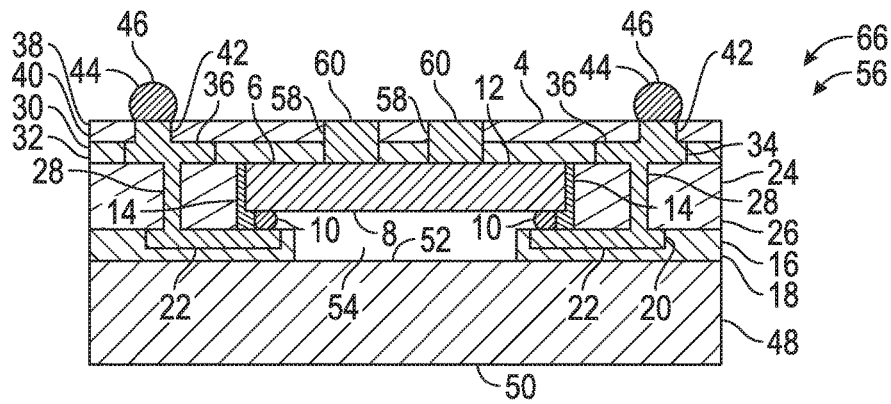
FIG. 2 is a cross-section view of another implementation of an embedded image sensor package.

FIG. 2 shows another implementation of a package. FIG. 2 shows an embedded image sensor package (package) 56 that is identical to package 2 except including thermally conductive vias (vias) 58 that are formed in openings in the layers 38 and 30 to provide thermal dissipation from the chip to the outer surface 4 of the package for cooling of the chip. These are formed of a thermal dissipation metal (metal) 60 and are coupled with the second side of the image sensor chip and exposed at the outer surface 4 of the package. In the representative illustration of FIG. 2 they are formed of copper, though they could be formed of any materials described above with respect to traces 22. The formation of openings in layers 38 and 30 where the vias 58 are formed, and the deposition of thermally conductive material and/or removal of excess thermally conductive material, may include any material deposition and/or removal processes described above for other elements of package 2.

Figure 3:
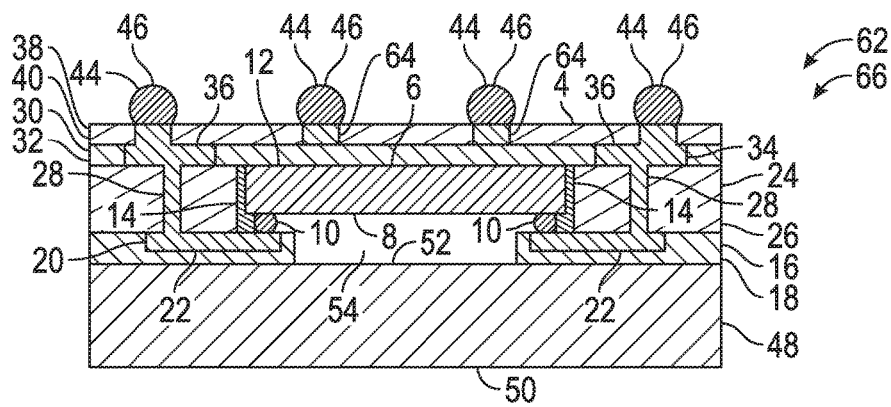
FIG. 3 is a cross-section view of another implementation of an embedded image sensor package.

FIG. 3 shows an embedded image sensor package (package) 62 that is similar to package 2 except that layer 38 includes additional conductive horizontal elements (traces) 64 for the placement of additional electrical contacts 44, such as for additional electrical communication between the image sensor and electrical contacts outside the package. The electrical contacts 44 of package 62 are solder bumps 46 though, as described with respect to package 2, they could be contact pads or the like instead. Package 62 thus includes a ball grid array (BGA) configuration that may have more solder bumps overall and/or may have more solder bumps per area at the outer surface 4 of the package, or the like, relative to package 2. Solder bumps or electrical contacts that are in relatively closer proximity to the chip than other solder bumps may provide for thermal conduction of heat away from the chip in addition to electrical coupling (though all solder bumps may provide some thermal conduction away from the chip).

Figure 4:
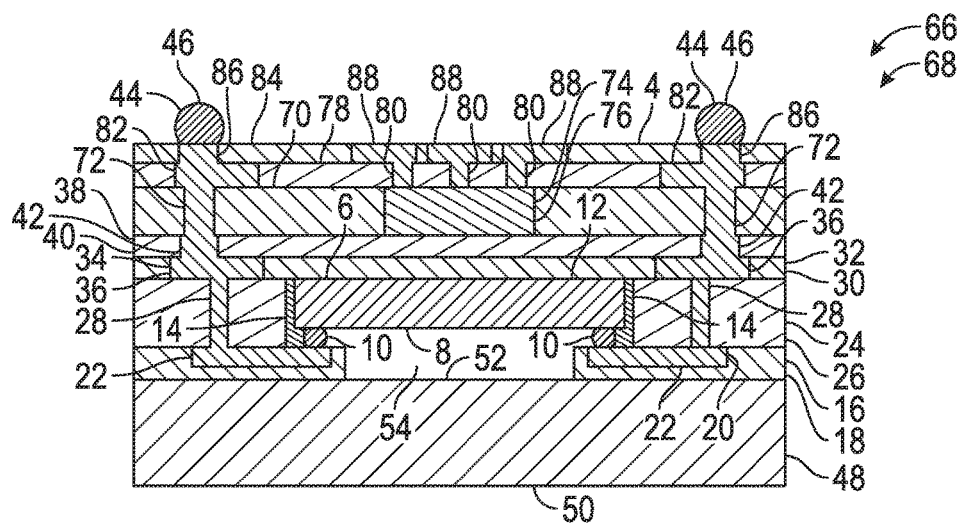
FIG. 4 is a cross-section view of another implementation of an embedded image sensor package.

FIG. 4 shows an embedded semiconductor package (package) 68 that is in many ways similar to package 2 except that it includes additional layers for another embedded device and electrical contacts thereto. Thus the layer 38 in this case is not the topmost layer, but another electrically insulative layer (layer) 70 is formed over layer 38. Layer 70 may be formed and patterned using any materials and techniques described above with respect to layer 16, and in the representative example it is a laminate film (film lamination) patterned using the methods described above for layer 16.

FIG. 4 shows that openings are made in layer 70. In one of these openings an embedded device 74 is placed (which in the representative example is a processor chip (processor) 76, though in other implementations it could be any other active or passive component(s) such as a diode, transistor, integrated circuit, resistor, capacitor, inductor, memristor, and so forth, and/or any combination thereof. In other openings in layer 70 electrically conductive vias (vias) 72 are formed to electrically couple with vias 42. The embedded device is electrically coupled with the image sensor (though this coupling is not shown) and is mechanically coupled within a layer of the package, as is seen (in other implementations the image sensor chip and/or embedded device could be mechanically coupled within multiple layers of a package)

An electrically insulative layer (layer) 78 is formed over layer 70. Layer 78 may be formed and patterned using any materials and techniques described above with respect to layer 16, and in the representative example it is a laminate film (film lamination) patterned using the methods described above for layer 16. Openings are formed in layer 78, some of which are used to deposit electrically conductive vias (vias) 80 and others of which are used to deposit conductive horizontal elements (traces) 82, both of which generally form an electrically conductive layer existing within the layer 78. The vias 80 electrically couple with electrical contact pads (not shown) on the top surface of embedded device 74 and the traces 82 electrically couple with vias 72.

An electrically insulative layer (layer) 84 is formed over layer 78 and forms the outer surface 4 of the package 68. Layer 84 may be formed and patterned using any materials and techniques described above with respect to layer 16, and in the representative example it is a laminate film (film lamination) patterned using the methods described above for layer 16. Openings are formed in layer 84, some of which are used to deposit electrically conductive vias (vias) 86 and others of which are used to deposit conductive horizontal elements (traces) 88. The traces 88 electrically couple with the vias 80 and the vias 86 electrically couple with traces 82. Electrical contacts 44 are formed over the vias 86. In the representative example these are shown to be solder bumps 46, though in other implementations they could be electrical contact pads or the like. The traces 88 may be used to electrically couple one or more elements external to the package with the embedded device 74 and/or to electrically couple the embedded device 74 with the image sensor chip.

Several of the layers, traces, vias, etc. of package 68 may be used for redistribution of electrical elements (i.e., they may form redistribution layers), though in implementations where more or fewer redistribution layers are needed more or fewer layers, traces, vias, etc., may be used. Thus other packages could have more layers or fewer layers, as needed or as desired. Package 68 is seen, as with the other packages described herein, to have a ball grid array (BGA) 66 configuration, though in other implementations other configurations may be used.

Figure 5:
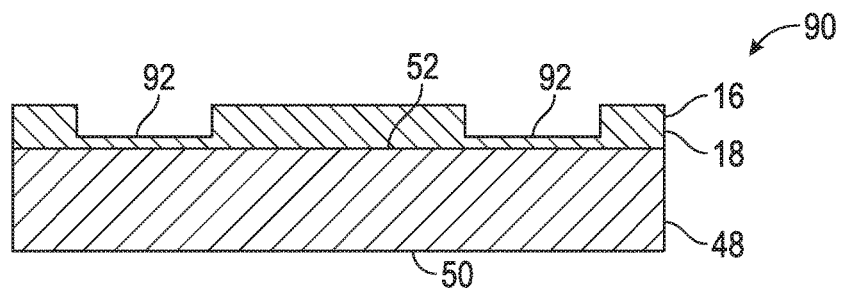
FIG. 5 is a cross-section view of an assembly used in the formation of the package of FIG. 1.

FIGS. 5-11 will now be described, which representatively illustrate methods of formation of an embedded image sensor package (package) 2, but these methods equally apply to the other packages herein though the other packages will include additional processing steps. FIG. 5 shows an assembly 90 which includes a transparent cover 48 having a first side 50 and a second side 52 opposite the first side. An electrically insulative layer (layer) 16 is coupled over the second side of the transparent cover, and is formed of a laminate film 18 as previously described. Recesses 92 are formed in the laminate film, using any of the methods previously described such as photolithography and/or plasma etching.

Figure 6:
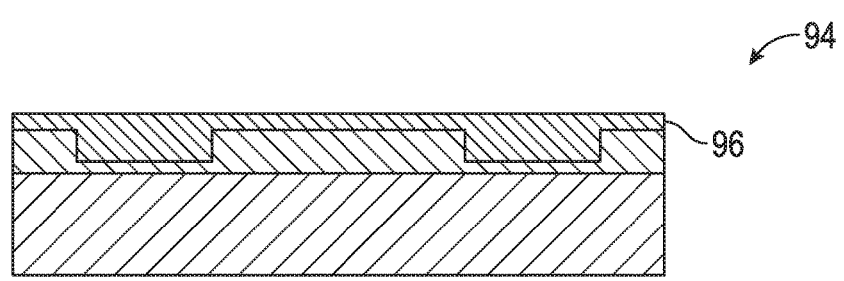
FIG. 6 is a cross-section view of an assembly formed from the assembly of FIG. 5 and used in the formation of the package of FIG. 1.

FIG. 6 shows an assembly 94 which is similar to assembly 90 except that an electrically conductive layer (layer) 96 has been deposited over layer 16. Layer 96 is seen to fill the recesses of layer 16 and to additionally cover the top surface of layer 16. In the representative example the layer 96 is a metal layer.

Figure 7:
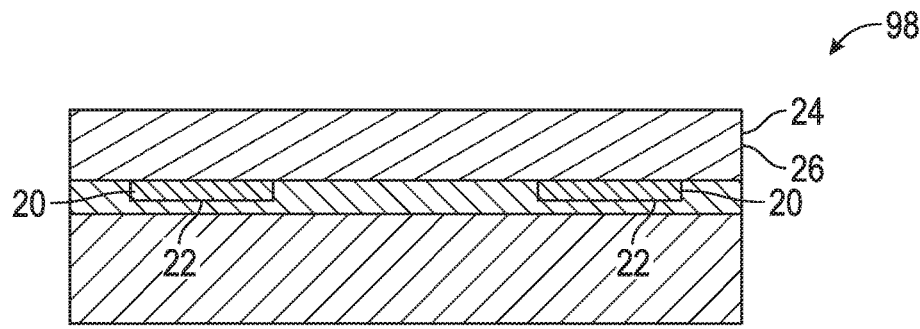
FIG. 7 is a cross-section view of an assembly formed from the assembly of FIG. 6 and used in the formation of the package of FIG. 1.

FIG. 7 shows an assembly 98 which is formed by further processing to assembly 94. The thickness of assembly 94 is first reduced using a grinding/polishing process, which removes the excess metal so that only the metal within the recesses remains (and this may also remove some of the material of layer 16 as previously described). This forms electrically conductive layer (layer) 20 which includes the conductive horizontal elements (traces) 22 previously described. An electrically insulative layer (layer) 24, which in the implementation shown is a laminate film 26, is then coupled over layers 16 and 20.

Figure 8:
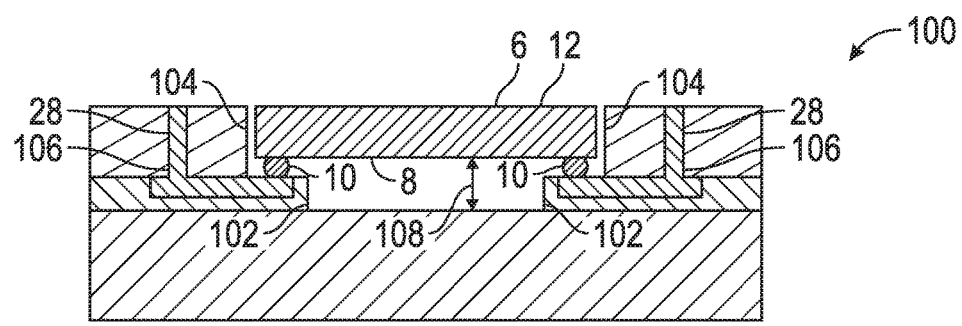
FIG. 8 is a cross-section view of an assembly formed from the assembly of FIG. 7 and used in the formation of the package of FIG. 1.

FIG. 8 shows an assembly 100 which is formed by further processing to assembly 98. An opening 102 is formed in layer 16 and exposes the second side of the transparent cover. Openings 106 are formed in layer 24 which are filled with an electrically conductive material to form vias 28. Excess material may be removed such as through another grinding/polishing process or through selective etching so that the top surface of layer 24 is not covered with the electrically conductive material. An opening 104 is then made in layer 24, exposing the traces 22, and electrical contacts (such as contact pads, not shown) on the first side 8 of the image sensor chip (chip) 6 are mechanically and electrically coupled with the traces 22 using bumps 10 through a reflow process. Chip 6 is seen to have a second side 12 opposite its first side, and a gap 108 is seen to be formed between the chip and the transparent cover.

Figure 9:
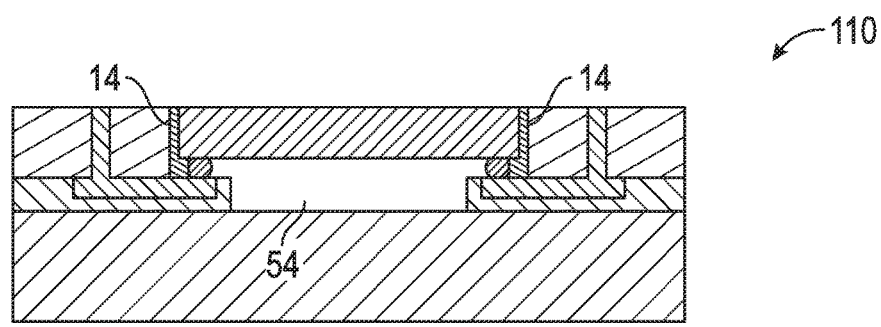
FIG. 9 is a cross-section view of an assembly formed from the assembly of FIG. 8 and used in the formation of the package of FIG. 1.

FIG. 9 shows an assembly 110 which is formed by further processing to assembly 100. An underfill material 14 is used to seal gaps between the sides of the chip and the layer 24 using a capillary underfill process, as has been described, so that an airtight cavity (cavity) 54 is formed between the image sensor and the transparent cover. The airtight cavity is thus defined by the chip, the transparent cover, the underfill material, and in some cases (depending on how far the underfill material flows) the solder bumps, the traces 22, and/or the layer 16. All of these elements (or sub-combinations thereof depending on the implementation) jointly form a hermetic seal that protects the image sensor—though the hermetic seal is not formed until the underfill material is deposited and solidifies. These elements that jointly form the hermetic seal are low moisture absorption materials, which provides for protection of the image sensor by not permitting ingress of undesired amounts of moisture into the cavity after cavity formation and during other processing and use of the package.

Figure 10:
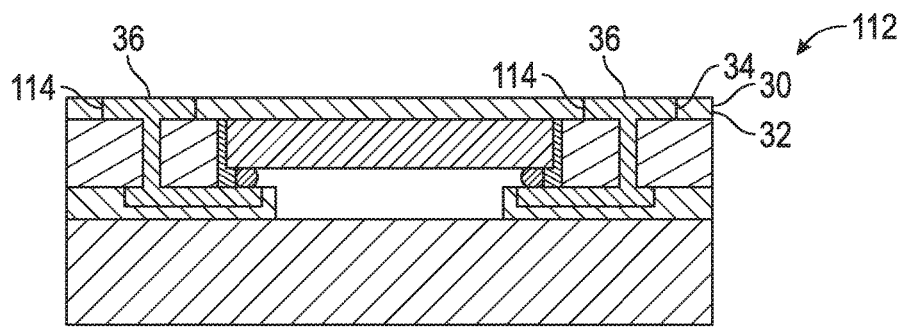
FIG. 10 is a cross-section view of an assembly formed from the assembly of FIG. 9 and used in the formation of the package of FIG. 1.

FIG. 10 shows an assembly 112 that is formed by further processing to assembly 110. An electrically insulative layer (layer) 30, which in the implementation shown is a laminate film 32, is coupled over layer 24, and openings 114 are formed therein, using any of the methods described above such as etching, drilling, etc., and traces 36 are formed therein. Traces 36 may be formed by any material deposition process and a grinding/polishing or an etching process to remove excess material.

Figure 11:
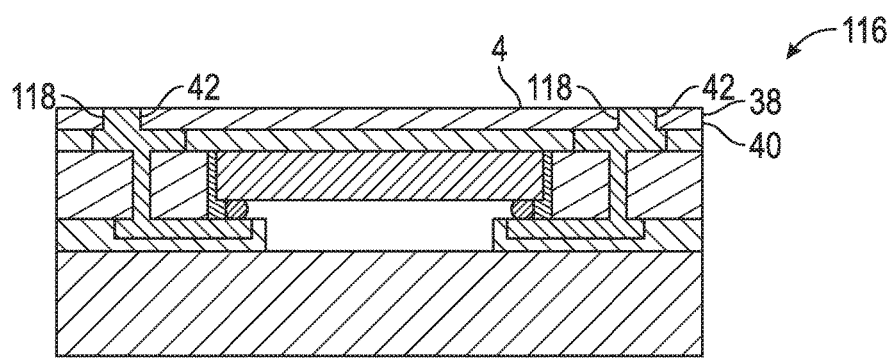
FIG. 11 is a cross-section view of an assembly formed from the assembly of FIG. 10 and used in the formation of the package of FIG. 1.
Figure 12:
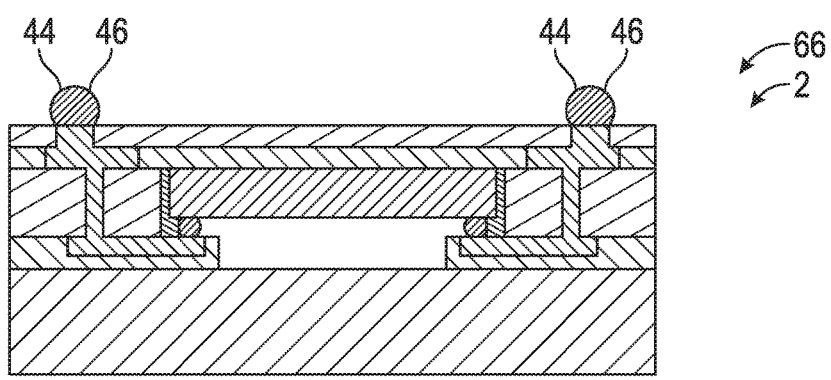
FIG. 12 is a cross-section view of an assembly formed from the assembly of FIG. 11 and is identical to the package shown in FIG. 1.

FIG. 11 shows an assembly 116 that is formed by further processing to assembly 112. An electrically insulative layer (layer) 38, which in the implementation shown is a laminate film 40, is coupled over layer 30, and openings 118 are formed therein, using any of the methods described above such as etching, drilling, etc., and vias 42 are formed therein. Vias 42 may be formed by any material deposition process and a grinding/polishing or an etching process to remove excess material.

FIG. 12 shows package 2 which is formed by further processing to assembly 116, by coupling electrical contacts 44 at the outer surface 4 of the package electrically coupled with vias 42. These could be contact pads, though in the implementation shown they are seen to be solder bumps 46 and to form a ball grid array (BGA) 66 configuration.

The packages described herein do not use a glass attach resin to couple the transparent cover with other elements of the package, though that is used in conventional image sensor packages (such as conventional ball grid array (BGA) and plastic leaded chip carrier (PLCC) image sensor packages). Glass attach resins may absorb water moisture that may later penetrate into an air cavity between the image sensor and the transparent cover. This can increase pressure within the cavity during high temperature or reflow processes (such as during surface mount technology (SMT) processes), and can cause "popcorn" or delamination effects. Moisture in such conventional packages can also condensate on the transparent cover and/or on the image sensor causing image quality defects or image sensor failure or otherwise degrading image sensor functions. After SMT any delamination of a glass attach resin may allow moisture to enter the cavity and cause bond pad corrosion if the pads contain small amounts of corrosive ions (such as F). The use of the elements and methods described herein remove the potential moisture damage and corrosion that may be present with conventional image sensor packages because the cavity is hermetically sealed, preventing moisture from entering therein, and because no glass attach resin is used.

It may be seen that none of the packages and methods described herein include a polymer dam used to stop a liquid flow, and no liquid encapsulant (apart from the underfill material) is used. In some conventional image sensor packages a polymer dam is used to prevent a flow of resin, encapsulant, or some other material from flowing over or onto the image sensor or some other area of the package where it is not desirable to have the liquid flow. Because no liquid encapsulant other than the underfill material is used, no polymer dam is needed. The lack of a polymer dam and of a liquid encapsulant other than the underfill material, and the flip chip bonding to layer 16, may result in fewer and less expensive processing steps compared with conventional image sensors and processing methods. For example, the substrate and package are essentially formed during the same processing steps since the substrate (layer 16) forms one of the layers within the package. Further, polymer dams can absorb moisture that is later released into the cavity, so the exclusion of a polymer dam may increase reliability of the package by removing a mechanism for moisture issues as described above.

The packages described herein do not include wirebonds, although they are used in conventional image sensor packages. Wirebonds require a larger gap between the image sensor and the transparent cover to allow space for the wirebonds so that they are not damaged. The use of the elements and methods described herein thus allows for a smaller gap and, accordingly, a smaller overall package size relative to conventional image sensor packages.

The packages described herein do not include many different polymer materials, though many different polymer materials are used in conventional image sensor packages. For example, conventional image sensor packages may use different polymers for polymer dams, die attach materials, glass attach materials, substrate material, and so forth. The use of many different polymer materials results in a higher coefficient of thermal expansion (CTE) mismatch risk which can result in delamination, cracks, openings, moisture entry into the cavity, and the like and which may reduce reliability. The use of the elements and methods described herein in some implementations reduces or eliminates CTE mismatch issues because in implementations all or substantially all of the polymer-containing materials are formed of the same laminate film material.

Because packages described herein use a flip chip bonding technique, no polymer bond glue is needed for the image sensor chip and the gap size between the image sensor and transparent cover may be controlled and/or modified using only stud bumps (or other electrically conductive elements between the first side of the image sensor chip and the traces 22) and the lamination thickness of layer 16. In implementations the image sensor array may further be protected by a coating applied over the image sensor area of the image sensor chip.

The use of a hermetically sealed cavity, as described above, to protect the image sensor, may thus result in an increased reliability of the package. It may be seen in the representative examples that the image sensor chip is fully embedded within the package structure. The metal elements (traces, vias, electrically conductive layers, etc.) may all be used for thermal dissipation of heat away from the image sensor chip during use. Although only one package is shown in each of the drawings, it may be understood that the processes described herein may include wafer level packaging and that after these processes wafers may be singulated to each form many of the individual packages shown in FIGS. 1-4.

It should be understood that the elements shown in the drawings are not drawn to scale, but the relative sizes/thicknesses of some elements are exaggerated and/or otherwise changed for ease of viewing all of the elements.

In places where the description above refers to particular implementations of embedded image sensor semiconductor packages and related methods and implementing components, sub-components, methods and sub-methods, it should be readily apparent that a number of modifications may be made without departing from the spirit thereof and that these implementations, implementing components, sub-components, methods and sub-methods may be applied to other embedded image sensor semiconductor packages and related methods.

What is claimed is:

1. An embedded image sensor package, comprising:
   a transparent cover having a first side and a second side opposite the first side;
   a first layer coupled over the second side of the transparent cover, the first layer comprising an opening therein;
   an electrically conductive layer coupled one of in and over the first layer and electrically coupled with one or more electrical contacts exposed on an outer surface of the package, and;
   an image sensor chip having a first side and a second side opposite the first side of the image sensor chip, the first side of the image sensor chip comprising an image sensor, the image sensor chip electrically coupled with the electrically conductive layer at the first side of the image sensor chip, the image sensor chip coupled over the first layer so that the first side of the image sensor chip faces the second side of the transparent cover through the opening;
   wherein the entirety of the first layer and the entirety of the electrically conductive layer are each substantially parallel with the image sensor chip;
   wherein the image sensor chip and the transparent cover at least partially define a cavity that is hermetically sealed using an underfill material, and;
   wherein the package comprises no wirebonds.

2. The package of claim 1, wherein the image sensor chip is electrically coupled with the electrically conductive layer using one or more bumps.

3. The package of claim 1, wherein the package is formed without the use of any liquid encapsulant except for the underfill material.

4. The package of claim 1, wherein the package does not include a polymer dam used to stop a liquid flow.

5. The package of claim 1, wherein the package does not include a die bond glue coupled with the image sensor chip.

6. The package of claim 1, further comprising a thermal dissipation metal coupled with the second side of the image sensor chip and exposed on the outer surface of the package through one or more layers of the package.

7. The package of claim 1, further comprising an embedded device electrically coupled with the image sensor chip and mechanically coupled within one or more layers of the package, the embedded device comprising one of a passive component and a processor.

8. The package of claim 1, wherein the one or more electrical contacts form a ball grid array (BGA) structure.

9. An embedded image sensor package, comprising:
   a transparent cover having a first side and a second side opposite the first side;
   a first layer coupled over the second side of the transparent cover, the first layer comprising a laminate film having an opening therein;
   an electrically conductive layer coupled one of in and over the first layer and electrically coupled with one or more electrical contacts exposed on an outer surface of the package, and;
   an image sensor chip having a first side and a second side opposite the first side of the image sensor chip, the first side of the image sensor chip comprising an image sensor, the image sensor chip mechanically and electrically coupled with the electrically conductive layer at the first side of the image sensor chip using one or more bumps, the image sensor chip coupled over the first layer so that the first side of the image sensor chip faces the second side of the transparent cover through the opening;
   wherein the entirety of the first layer and the entirety of the electrically conductive layer are each substantially parallel with the image sensor chip;
   wherein the image sensor chip, the first layer, and the transparent cover at least partially define a cavity that is hermetically sealed using an underfill material; and
   wherein the first layer extends from an outer edge of the package to an edge of the cavity.

10. The package of claim 9, wherein the package is formed without the use of any liquid encapsulant except for the underfill material, wherein the package does not include a die bond glue coupled with the image sensor chip, and wherein the package does not include a polymer dam used to stop a liquid flow.

11. The package of claim 9, further comprising a thermal dissipation metal coupled with the second side of the image sensor chip and exposed on the outer surface of the package through one or more layers of the package.

12. The package of claim 9, further comprising an embedded device electrically coupled with the image sensor chip and mechanically coupled within one or more layers of the package, the embedded device comprising one of a passive component and a processor.

13. An embedded image sensor package, comprising:
   a transparent cover having a first side and a second side opposite the first side;
   a first layer coupled over the second side of the transparent cover, the first layer comprising an opening therein;
   an electrically conductive layer coupled one of in and over the first layer;
   a second layer coupled over the electrically conductive layer, the second layer comprising an opening therein;
   a plurality of vias formed in the second layer;
   an image sensor chip within the opening of the second layer, the image sensor chip having a first side and a second side opposite the first side of the image sensor chip, the first side of the image sensor chip comprising an image sensor, the image sensor chip electrically coupled with the electrically conductive layer at the first side of the image sensor chip, the image sensor chip coupled over the first layer so that the first side of the image sensor chip faces the second side of the transparent cover through the opening; and
   a third layer coupled over the image sensor and the entirety of the second layer, the third layer comprising conductive portions coupled over the plurality of vias formed in the second layer;
   wherein the electrically conductive layer is electrically coupled with one or more electrical contacts exposed on an outer surface of the package through the plurality of vias formed in the second layer;
   wherein the image sensor chip, the first layer, and the transparent cover at least partially define a cavity that is hermetically sealed using an underfill material, and;
   wherein the package comprises no wirebonds.

14. The package of claim 13, wherein a second side of the second layer is level with second side of the image sensor chip.

15. The package of claim 13, wherein the first layer is directly coupled to the transparent cover.

16. The package of claim 13, wherein the image sensor chip is electrically coupled with the electrically conductive layer using one or more bumps.

17. The package of claim 13, further comprising a thermal dissipation metal coupled with the second side of the image sensor chip and exposed on the outer surface of the package through the third layer of the package.

18. The package of claim 13, further comprising an embedded device electrically coupled with the image sensor chip and mechanically coupled within one or more layers of the package, the embedded device comprising one of a passive component and a processor.

19. The package of claim 13, wherein the one or more electrical contacts form a ball grid array (BGA) structure.

20. The package of claim 13, wherein the underfill material is directly coupled to the electrically conductive layer, the second layer, the third layer, and the image sensor chip.

* * * * *